United States Patent [19]

Ford et al.

[11] Patent Number: 4,532,534
[45] Date of Patent: Jul. 30, 1985

[54] MOSFET WITH PERIMETER CHANNEL

[75] Inventors: Raymond T. Ford, Mountaintop, Pa.;
Norbert W. Brackelmanns, Ironia,
N.J.; Carl F. Wheatley, Jr., Drums;
John M. S. Neilson, Norristown,
both of Pa.

[73] Assignee: RCA Corporation, Princeton, N.J.

[21] Appl. No.: 415,486

[22] Filed: Sep. 7, 1982

[51] Int. Cl.³ .............................................. H01L 29/78
[52] U.S. Cl. .................................. 357/23.4; 357/23.8;
357/23.14
[58] Field of Search ................... 357/23.4, 23.8, 23.14,
357/55

[56] References Cited

U.S. PATENT DOCUMENTS 4,072,975  2/1978  Ishitani .................................... 357/23
4,145,700  3/1979  Jambotkar .............................. 357/23

FOREIGN PATENT DOCUMENTS 2033658A  5/1980  United Kingdom .

Primary Examiner—Martin H. Edlow
Assistant Examiner—Terri M. Henn
Attorney, Agent, or Firm—Birgit E. Morris; Donald S. Cohen; Kenneth R. Glick

[57] ABSTRACT

A vertical MOSFET device includes a major surface having an active, gate-controlled portion adjacent to an inactive portion. A gate-controlled perimeter channel is disposed at the boundary between the active and inactive portions.

4 Claims, 4 Drawing Figures

MOSFET WITH PERIMETER CHANNEL

BACKGROUND OF THE INVENTION

The present invention relates to insulated gate field effect transistors (IGFETs) such as metal oxide semiconductor field effect transistors (MOSFETs). More particularly, the invention relates to vertical MOSFETs used in power applications, such as vertical, double diffused MOSFETs, commonly referred to in the industry by such terms as VDMOS, DMOS, HMOS, TMOS and HEXFET (HEXFET being a TM of International Rectifier, El Segundo, CA).

In a conventional vertical MOSFET, source and drain regions are provided on opposite surfaces of a semiconductor pellet. A body region is disposed between the source and drain regions, and during MOSFET operation, current flows between the source and drain regions through a channel within the body region. The channel is commonly provided on the same semiconductor surface as the source region, although in certain designs, sometimes referred to as VMOS, the channel is disposed on the surface of a groove in the semiconductor surface. The channel is conventionally described in terms of its length, i.e. the spacing between the source and drain regions at the semiconductor surface, and its width, i.e., the dimension perpendicular to the length. Channel width, which might conveniently be measured in units of centimeters, is typically far greater than channel length, which is frequently measured in units of microns.

Current flow through the channel is controlled by the voltage applied to an overlying gate. It is usually desirable to have a small channel length for ease of electrical switching, and to have a large channel width for increased current carrying ability and reduced on resistance, $R_{ON}$. Conventional channel configurations include a single meandering line, a plurality of stripes, and a plurality of cells of a particular geometric shape arranged in a matrix.

In a vertical MOSFET power device, the semiconductor surface from which the source region and channel extend can be considered to comprise two major areas; (1) an active, gate-controlled portion, and (2) an adjacent inactive, perimeter portion. As the nomenclature implies, the active, gate-controlled portion is surrounded by the inactive portion; the inactive portion extending to the edge of the semiconductor pellet. The active, gate-controlled portion encompasses the area covered by the channel(s). The inactive, perimeter portion typically incorporates a voltage-supporting means such as a field plate, a mesa edge, a passivation coating, or some combination of these structures. An example of a field plate which might be used at the inactive perimeter portion can be found in SEMICONDUCTOR POWER DEVICES by S. K. Ghandi, John Wiley & Sons, 1977, pp. 66-70.

Within the general framework of conventional vertical MOSFET structures, we have discovered a modification which serves to increase the device current carrying capability and to decrease its $R_{ON}$. Furthermore, our invention can be implemented into a conventional device fabrication process with relative ease.

SUMMARY OF THE INVENTION

In a vertical MOSFET device which includes a major surface having an active, gate-controlled portion adjacent to an inactive portion, a gate-controlled perimeter channel is disposed at the boundary between the active portion and the inactive portion.

DETAILED DESCRIPTION

Figure 1:
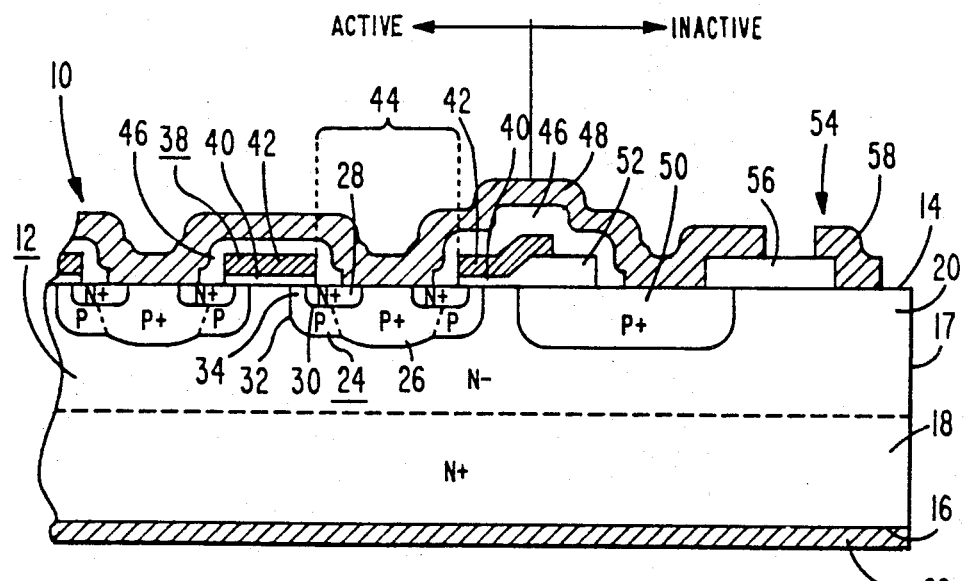
FIG. 1 is a sectional view of a conventional vertical MOSFET device. It illustrates a typical active, gate-controlled portion, a typical inactive, perimeter portion, and the boundary therebetween.
Figure 3:
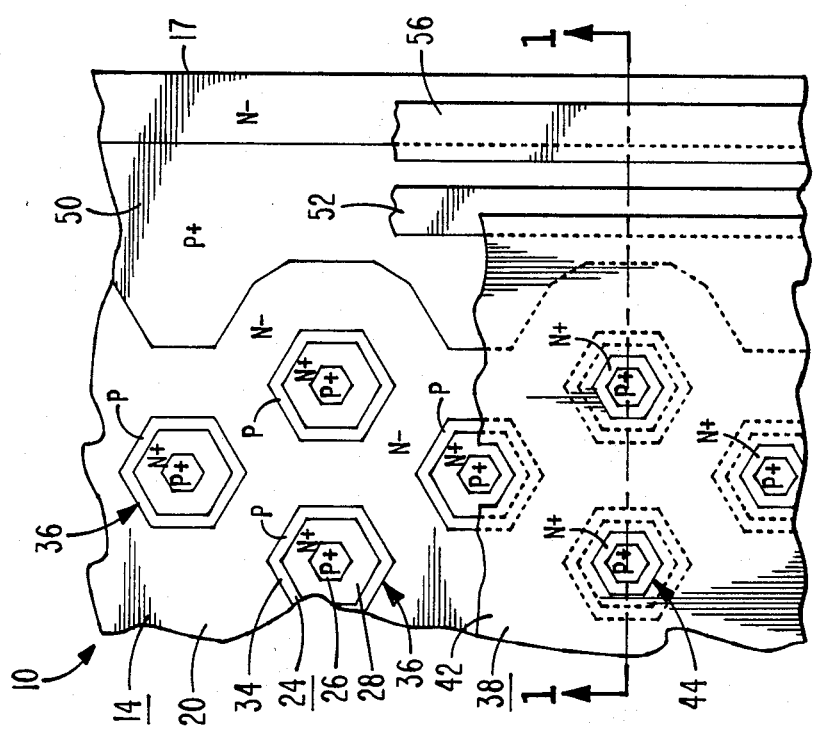
FIG. 3 is a top view of the conventional device of FIG. 1 with certain portions wholly or partially removed for clarity.

Illustrated in FIG. 1 is a section of a portion of a conventional vertical, double diffused MOSFET (hereinafter VDMOS) device 10. The device is fabricated on a semiconductor pellet 12 having first and second opposing major surfaces, 14 and 16 respectively, and an edge 17. A view of the first major surface 14 is illustrated in FIG. 3. The upper portion of the illustration in FIG. 3 represents the semiconductor surface 14, while the lower portion of FIG. 3 illustrates some of the layers which overlie the surface 14 as well. The section line 1—1 in FIG. 3 represents the section illustrated in FIG. 1.

As illustrated in FIG. 1, the pellet 12 comprises an N+ type conductivity layer 18 disposed at the second surface 16 and an N− type layer 20 disposed across the N+ layer 18 and extending to the first surface 14. Layers 20 and 18 are the drain region of the device 10, and a drain electrode 22 is disposed across the second surface 16, in ohmic contact with the N+ layer 18.

As shown in FIG. 1, the first surface 14 consists of an active portion and an inactive portion. Extending from the first surface 14 in the active portion are a plurality of P type body regions 24, each of the body regions 24 including a heavily doped, P+ type central portion 26 also extending from the first surface. Each body region forms a body/drain junction 32 at its interface with the N− layer 20 of the drain region. As illustrated in FIG. 3, the body regions 24 are each hexagonal in shape and are arranged in a two dimensional matrix on the first surface 14.

Within the boundaries of each body region 24, an N+ type source region 28 is disposed so as to form a source/body junction 30. As shown in FIG. 3, the source regions 28 are each hexagonal-ring shaped and are each concentric with a corresponding body region 24 such that the P+ central portion 26 of each body region 24 is surrounded by a source region 28 at the first surface.

At the first surface 14, the spacing between the source/body junction 30 and body/drain junction 32 defines a channel 34 in the body region 24. Hereinafter, the first surface area enclosed by the outer perimeter of each of the hexagonally shaped channels 34 will be referred to as a cell 36 of device 10. As shown in FIG. 3, the channel length of each of the cells 36 is equal. The channel width for the device 10 is equal to the sum of the channel widths of each of the cells 36 which it comprises. By way of example, a typical 100V, 1A power MOSFET device formed on a 60 mil×60 mil (1.5 mm×1.5 mm) pellet might have approximately 800 cells, a channel length of 2.4 microns and a total channel width of 6.7 cm.

As illustrated in FIG. 1, a gate 38, comprising a gate oxide 40 disposed on the first surface 14 and a gate electrode 42 disposed on the oxide 40, is disposed over the channel 34 of each cell 36 as well as over that portion of the N− drain layer 20 which extends to the first surface between neighboring cells. The lower portion of the illustration in FIG. 3 shows the configuration of the gate 38 on the surface 14. In this view the gate resembles a sheet of material having a plurality of apertures 44; an aperture 44 being disposed over the central portion of each cell 36 so as to expose the heavily doped P+ central portion 26 and a portion of the N+ type source region 28 surrounding the central portion 26.

As shown in FIG. 1, a dielectric material 46 covers the gate 38, and a source electrode 48 overlies the dielectric 46 and contacts the P+ portion 26 and N+ source region 28 at the first surface 14 through the apertures 44. For clarity, neither the dielectric material 46 nor the source electrode 48 are shown in FIG. 3.

A P+ type source-terminating region 50 is disposed at the first surface 14, and substantially delineates the boundary between the active, gate-controlled portion of the device and the inactive, perimeter portion. The source-terminating region 50 will typically be spaced from both the matrix of cells 36 and the pellet edge 17 by the N− drain layer 20. Overlying the source-terminating region 50 and surrounding the entire active area on the first surface is a relatively thick dielectric stripe 52. As shown in FIGS. 1 and 3, the gate electrode sheet 42 terminates on the thick dielectric stripe 52.

In the inactive, perimeter portion, surrounding the dielectric stripe 52 on the first surface 14 is an edge termination 54. The edge termination 54 is spaced from the dielectric stripe 52, is disposed over the source-terminating region 50, and extends toward the edge 17 of the semiconductor pellet 12. The edge termination 54 comprises a field oxide 56 and a field-terminating electrode 58. The field oxide 56 covers a portion of the source-terminating region 50, a portion of the N-drain layer 20 between the source-terminating region 50 and the pellet edge 17, and the boundary therebetween. The field-terminating electrode 58 overlies the edge of the field oxide 56 in proximity to the pellet edge 17, and contacts the surface 14 between the field oxide 56 and pellet edge. The source electrode 48 overlies the dielectric stripe 52 the field oxide 56, and contacts the source-terminating region 50 in the space between the dielectric stripe 52 and field oxide 56. The source electrode 48 terminates on the field oxide 56 at a point which overlies the N-drain layer between the source terminating region 50 and pellet edge 17. The source electrode 48 can additionally be spaced from the dielectric stripe 52 by dielectric material 46.

Figure 2:
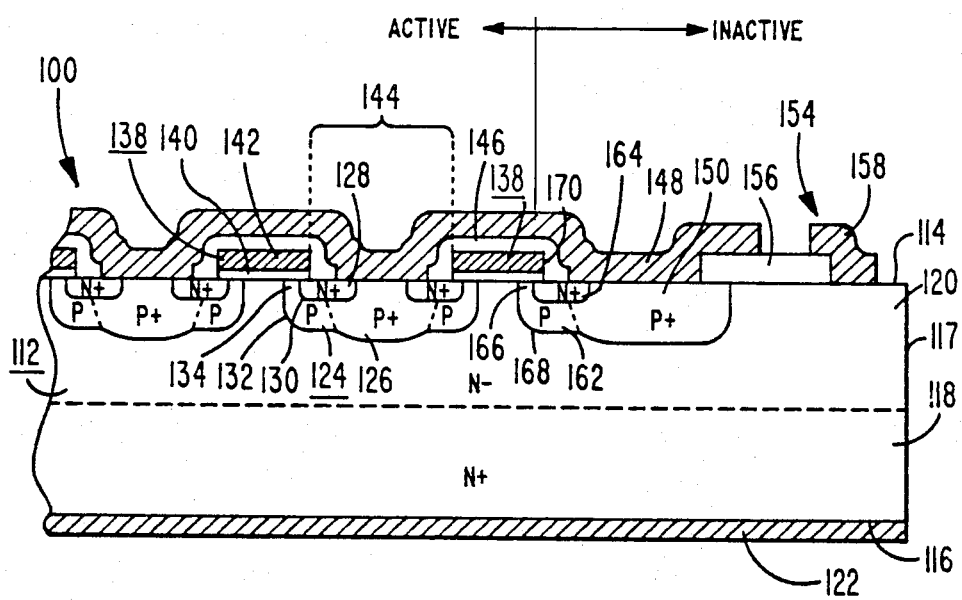
FIG. 2 is a sectional view of a vertical MOSFET device incorporating the present invention.
Figure 4:
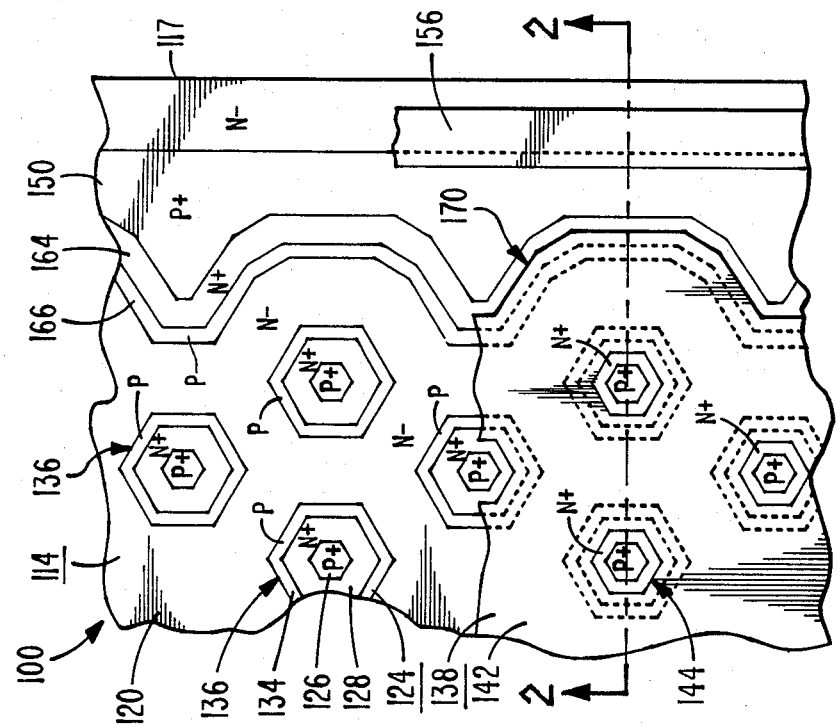
FIG. 4 is a top view of the device of FIG. 2, illustrating the present invention. Again, certain portions of the structure have been removed for clarity.

The improved structure of the present invention will become apparent with reference to device 100 illustrated in FIGS. 2 and 4. Analogous reference numerals (e.g. 32 and 132) are used to designate similarly functioning regions in the device 100 of the present invention and the conventional device 10. The device 100 comprises a semiconductor pellet 112 having first and second major surfaces 114 and 116 respectively, and the drain region again comprises an N+ type conductivity layer 118 across the second surface 116 and an N− type layer 120 adjacent to the N+ layer and extending to the first surface 114. A drain electrode 122 ohmically contacts the N+ type drain region 118 at the second surface 116. The first major surface 114 is again divided into active and inactive portions, with the inactive portion extending to the pellet edge 117.

A plurality of hexagonal-shaped P type body regions 124 project into the semiconductor pellet 112 from the first surface 114 and are arranged in a two dimensional matrix at the first surface as shown in FIG. 4. Again, each body region 124 includes a central, relatively heavily doped P+ type central portion 126. A hexagonal-ring-shaped N+ type source region 128 is disposed within the boundaries of each body region 124 such that the spacing between source/body junction 130 and body/drain junction 132 defines a channel 134 at the surface 114 in each cell 136. Surrounding the array of cells 136, a P+ type source-terminating region 150 extends into the substrate from the first surface 114, and delineates the inactive portion of the device 100.

The critical distinction of the device 100 over the prior art device 10 is the presence of a supplementary P type body region 162 and a supplementary N+ type source region 164, both of which extend from the first surface 114 and are adjacent to the source-terminating region 150. The supplementary body region 162 forms a body/drain junction 168 having a first surface intercept. The supplementary source region 164 which surrounds the active area of the device 100, is spaced from the body/drain junction 168 so as to form a perimeter channel 166.

Thus, the active/inactive boundary defined between drain region 20 and source-terminating region 50 at the surface 14 of the conventional device 10 is now replaced by an active, gate-controlled channel 166. Depending upon the actual geometry of the device, the present invention can contribute a significant increase in channel width. For example, incorporation of a perimeter channel into the 100V, 1A device previously cited would increase channel width from 6.7 cm to 7.6 cm. This would effectively decrease $R_{ON}$ by 13% since $R_{ON}$ is inversely proportional to device channel width.

The device 100 incorporates a gate 138, which comprises a gate oxide 140, a gate electrode 142 and apertures 144 in a similar manner as described with respect to the conventional device 10. However, whereas the prior art gate 38 terminated on a dielectric stripe 52, the edge 170 of the apertured gate 138 of the present invention conforms in shape generally to the contour of the perimeter channel 166, as shown in FIG. 4. The need for the dielectric stripe 52 of device 10, as shown in FIGS. 1 and 3, is obviated by the present invention.

An edge termination 154, similar to conventional edge termination 54, comprising a field oxide 156, and field-terminating electrode 158 extending toward the pellet-edge 117, forms an inactive, voltage supporting perimeter on the surface 114 of the device 100. Overlying all structures on the first surface 114 is a source electrode 148 which is isolated from the gate 138 by dielectric material 146, contacts the source-terminating region 150, and terminates on the surface of the field oxide 156 over the N− drain layer 120.

The device of the present invention can readily be manufactured using conventional processing techniques. No additional processing steps are required. To fabricate to structure of device 100 instead of the conventional device 10 merely requires the substitution of modified photomasks. Furthermore, one skilled in the art will recognize that the present invention is not limited to the geometric configuration disclosed herein. For example, the cells need not be of hexagonal shape, nor need they all be of the same shape, nor need they be arranged in a two dimensional array. It should also be emphasized that the edge terminations 54 and 154 are merely exemplary of those used in conventional vertical power MOSFETs. A large variety of conventional inactive edge terminations may be substituted.

What is claimed is:

1. A device in accordance with claim 1 wherein each body region is hexagonal in shape at said major surface.

2. A vertical MOSFET including a major surface having an active gate-controlled portion surrounded by an inactive portion, comprising:
    a body region adjacently surrounded by a drain region at said major surface;
    a source region, disposed within the boundaries of the body region and spaced from the drain region, so as to define a gate-controlled first channel in the body region at the major surface;
    a supplementary body region circumscribing said first channel and being spaced therefrom by the drain region; and
    a supplementary source region, disposed within the boundaries of the supplementary body region so as to define an active gate-controlled perimeter channel in the supplementary body region at the major surface, said perimeter channel circumscribing said first channel and being disposed at the boundary between the active portion and the inactive portion.

3. A device in accordance with claim 2, further comprising:
    a plurality of said body regions and said source regions arranged in a two dimensional array at said major surface wherein all of said body regions are circumscribed by said perimeter channel.

4. A device in accordance with Claim 2, wherein said inactive portion comprises:
    a source-terminating region of similar conductivity type to said body region surrounding said supplementary source region.

* * * * *

UNITED STATES PATENT AND TRADEMARK OFFICE
CERTIFICATE OF CORRECTION

PATENT NO. : 4,532,534

DATED : July 30, 1985

INVENTOR(S) : Raymond Thomas Ford et al.

It is certified that error appears in the above-identified patent and that said Letters Patent is hereby corrected as shown below:

Column 4, line 63: "to" should be --the--.

Claims 1 and 2 are improperly numbered:

"1." should be "2.".
"2." should be "1.".

Signed and Sealed this

First Day of October 1985

[SEAL]

Attest:

Attesting Officer

DONALD J. QUIGG

Commissioner of Patents and Trademarks—Designate